(12) United States Patent
McDougall et al.

(10) Patent No.: US 7,479,860 B2
(45) Date of Patent: Jan. 20, 2009

(54) MAGNETIC FIELD GENERATING ASSEMBLY AND METHOD

(75) Inventors: Ian Leitch McDougall, Oxon (GB); Robert Andrew Slade, Oxon (GB); Peter Hanley, Gloucestershire (GB); Robert Carter Hawkes, Cambridge (GB)

(73) Assignee: Oxford Instruments PLC, Oxon (GB)

( * ) Notice: Subject to any disclaimer, the term of this patent is extended or adjusted under 35 U.S.C. 154(b) by 213 days.

(21) Appl. No.: 10/528,146

(22) PCT Filed: Sep. 30, 2003

(86) PCT No.: PCT/GB03/04237

§ 371 (c)(1),
(2), (4) Date: Feb. 6, 2007

(87) PCT Pub. No.: WO2004/029645

PCT Pub. Date: Apr. 8, 2004

(65) Prior Publication Data

US 2007/0139148 A1    Jun. 21, 2007

(30) Foreign Application Priority Data

Sep. 30, 2002 (GB) ............... 0222625.6
Mar. 26, 2003 (GB) ............... 0306945.7

(51) Int. Cl.
*H01F 5/00* (2006.01)
(52) U.S. Cl. .............. 335/299; 324/319; 324/320
(58) Field of Classification Search ........... 335/216, 335/299; 324/318–320
See application file for complete search history.

(56) References Cited

U.S. PATENT DOCUMENTS

| | | | | |
|---|---|---|---|---|
| 4,689,591 A | * | 8/1987 | McDougall | 335/299 |
| 5,084,677 A | * | 1/1992 | McDougall | 324/320 |
| 5,162,768 A | * | 11/1992 | McDougall et al. | 335/296 |
| 5,717,333 A | * | 2/1998 | Frese et al. | 324/319 |
| 6,064,290 A | * | 5/2000 | Xu et al. | 335/296 |

FOREIGN PATENT DOCUMENTS

| | | |
|---|---|---|
| EP | 0 144 171 | 6/1985 |
| EP | 0 187 691 | 7/1986 |
| GB | 2 321 312 | 7/1998 |
| JP | 10-028682 | 2/1998 |
| WO | WO 98/43103 | 10/1998 |

* cited by examiner

*Primary Examiner*—Ramon M. Barrera

(57) ABSTRACT

A magnetic field generating assembly comprising a set (A1-A3;B1-B3;C1-C3) of, typically substantially coaxial, coils substantially symmetrically arranged about a plane orthogonal to the axis. At least some of the coils carry working currents in the opposite sense to the other coils The arrangement of turns and working currents carried by the coils is such that a first working volume (10) with a substantially homogeneous magnetic field is generated within the envelope defined by the assembly, and two second working volumes (11) each with a substantially homogeneous magnetic field are generated outside the envelope, the homogeneity of each of the first and second working volumes being sufficient to perform a NMR experiment on a sample in the working volume.

11 Claims, 3 Drawing Sheets

MAGNETIC FIELD GENERATING ASSEMBLY AND METHOD

This application claims the benefit of PCT International Application No. PCT/GB03/04237 filed Sep. 30, 2003 and United Kingdom Application Nos. 0222625.6, filed Sep. 30, 2002 and 0306945.7, filed Mar. 26, 2003, in Great Britain, the disclosures of which are incorporated herein by reference.

The invention relates to a magnetic field generating assembly and a method for designing such an assembly.

The invention is particularly concerned with magnetic field generating assemblies for generating a working volume within which the magnetic field is substantially homogenous to the extent that a nuclear magnetic resonance (NMR) experiment can be carried out on a sample in the working volume. Such assemblies are used for human body imaging as well as chemical analysis and the like.

Traditionally, such apparatus has been in the form of a coaxial set of coils at the centre of which a substantially homogenous working volume is generated. Homogeneity is achieved by balancing substantially to zero one or more of the non-zero orders defining the ($B_0$) magnetic field.

Assemblies of the type described above are widely employed for human body imaging and other magnetic resonance imaging functions but have the drawback that, particularly for human imaging, a person must be inserted in the bore of the assembly which makes it difficult for doctors to have access to the person as well as having undesirable psychological effects on the person concerned. Access is improved in "Open MRI" systems which use a split-pair coil arrangement based on the Helmholtz geometry, in which the pole spacing is equal to the pole coil's radii. However, the "letter-box" access afforded by this arrangement is still inadequate for many interventional procedures.

As a result, so-called "nested coil" arrangements have been developed where typically three or more coils are arranged coaxially and substantially coplanar with at least one energized in opposition to the others. The object of this arrangement is to produce a volume of uniform magnetic flux density in a region centred on the coils' axis, but at some distance away from the plane of the coils, so as to produce a volume suitable for performing NMR which is outside the envelope containing the field-producing apparatus. The nested coil arrangements overcome the problems mentioned above in connection with the traditional solenoid and Helmholtz arrangements but the magnetic field strength and size of the external working volumes is usually less than can be achieved internally of a solenoid.

In accordance with a first aspect of the present invention, a magnetic field generating assembly comprises a set of, typically substantially coaxial, coils substantially symmetrically arranged about a plane orthogonal to the axis, wherein at least some of the coils carry working currents in the opposite sense to the other coils, the arrangement of turns and working currents is carried by the coils being such that a first working volume with a substantially homogeneous magnetic field is generated within the envelope defined by the assembly, and two second working volumes each with a substantially homogeneous magnetic field are generated outside the envelope defined by the assembly, the homogeneity of each of the first and second working volumes being sufficient to perform a NMR experiment on a sample in the working volume.

This invention provides an assembly which has both a traditional, large central working volume of high field strength and high homogeneity and a pair of external (second) working volumes which typically will be of lower field strength and smaller radius for the same homogeneity than the first working volume but with the advantage that a sample can be placed in one or other of the working volumes depending upon the experiment to be performed. In the case of large samples, such as patients, it may even be possible to undertake two NMR experiments simultaneously on the different parts of the body in the two working volumes.

The present invention describes a magnet comprising a symmetrical arrangement of coils which generate a large homogeneous field volume within the coil structure, and a pair of smaller working volumes outside the structure. A patient can be placed in the former for high quality, large field of view (FOV) MR imaging, without access, or in the latter for lower quality, smaller FOV imaging, with good access. Many surgical procedures can be envisaged in which the patient is shuttled back and forth between the two regions to satisfy the different imaging requirements at various stages of the procedure. This can be achieved by moving either the patient table or the magnet.

For example, for removal of a brain tumor, the initial surgical planning would require the large FOV and high image quality of the inner working region, but no access to the head is needed at this stage. During surgical resection the surgeon will often wish to view real-time or quasi real-time images to check on progress, and these can be conducted in one of the external working volumes, which afford a high degree of access to the patient.

Clearly there are many reasons why it is beneficial to avoid patient motion during surgery, but a particular reason related to imaging is the need to maintain the internal organs in the same position with respect to the external body structure, which is the usual frame of reference for the image and surgical planning. Large displacements of the organs can occur when the body is moved, and if this occurs during surgery the image registration will be compromised. An advantage of the present invention is that the two working volumes are positioned very close together, so that minimal movement of the patient is required compared to prior art systems which envisage interventional imaging systems. Preferably, the magnet is moved over the stationary patient to position the structures to be imaged within the required working volume.

Clearly open gradient and RF coil structures which preserve the access to the external working volume are required. Many examples are described in the prior art. In one aspect of the invention, different gradient and RF coil geometries are employed at each of the external working volumes, designed to give access suited to different surgical procedures. The gradient and RF coils for the inner working volume may be largely conventional. In view of the the likely use of the system as a sequential use of an inner and outer region then shimming each of the regions in use may be necessary, even at the expense of degrading the unused region. That is to say the central region should benefit from shimming, as is well known in the art, when in use and likewise the outer region can benefit from shimming when in use. It is likely to be necessary to remove or shim out higher order field inhomogeneity ($Z_3$ for instance) to increase the size of the external homogeneous volume.

The coils will usually be substantially coaxial but this will not always be the case.

Although the coils could be arranged independently of each other and on separate radii, it is convenient both for the purposes of mathematical derivation and physical construction to arrange the coils in groups with members of each group being connected in series.

Typically, each member of a group will have substantially the same mean radius as the other members of the group although the mean radii of different groups can be different. This makes it simpler to mount the coils on formers, for example.

As explained above, to achieve homogeneity, it is necessary to balance non-zero orders of the magnetic field in the working volumes. It is possible to define the coils and working currents such that only when the complete assembly is operational do the first and second volumes of substantially homogeneous field appear. It is particularly convenient however, when the coils are arranged in groups, if each group generates by itself a substantially homogeneous magnetic field in the first working volume.

This enables the assembly more easily to be designed since each group will continue to generate a substantially homogenous field within the first working volume whatever current is passing through the coils of that group. Attention can then be given to the second working volumes and the combination of currents in the groups (magnitude and direction) needed to achieve homogeneity in the second working volumes.

The size of each working volume is defined by the region over which the magnetic field varies by less than a predetermined amount as determined by the imaging procedure. Typically the RF bandwidth limits the maximum field variation over the working volume to the order of a few Gauss or less. High speed, high quality imaging requires a tighter spec, typically better than 100 ppm after field shimming.

It will be necessary for the current in at least one group to counterrun with respect to the currents in other groups. In view of this, it is preferable to include a switch to enable the current in the one group to be reversed. Although this will destroy the homogeneity in the second working volumes, if each group generates by itself a homogeneous region within the first working volume the reversing the current in one of the groups will increase the strength of the magnetic field in the first working volume.

In summary therefore, the invention contemplates two classes of apparatus:

1) Apparatus comprised of three or more groups (sub-sets) of coils, each group being capable of generating an internal homogeneous volume in isolation. These can be switched between two modes:

Strong internal homogeneous field only (all coils adding, no coils counter-running)

Weaker internal homogeneous field, plus two external homogeneous field regions

2) Apparatus in which no sub-set of coils generates any region of homogeneous field, either inside or outside the structure. All coils are required to create the internal and twin-external working volumes.

In accordance with a second aspect of the present invention, a method of designing a magnetic field generating assembly comprises defining an arrangement of three groups of coils which are substantially coaxial and each of which generates a substantially homogenous magnetic field within a first working volume at the centre of each group; and determining working currents which must flow through the groups of coils in order to generate a substantially homogenous region in a second working volume external to the assembly.

Preferably, the method further comprises a second design step of merging coils to simplify the magnet structure and remove redundancy whilst still generating substantially the same internal and external working volumes.

Typically, in order to achieve the magnetic field strength required for most NMR experiments, the coils will be formed of superconducting material, either traditional low temperature wire or high temperature materials. In either event, in order to achieve the superconducting condition, the coils will normally be maintained at relatively low temperature such as liquid nitrogen or liquid helium temperatures.

Some examples of magnetic field generating assemblies and methods according to the invention will now be described with reference to the accompanying drawings, in which.

Consider a system of coaxial coil pairs consisting of infinitely thin hoops with radii $a_1$, $a_2$, $a_3$, etc. and axial positions $b_1$, $b_2$, $b_3$, etc. disposed symmetrically about the centre plane. As known from prior art the magnetic field variation over a sphere inside the coil structure can be expressed in terms of a harmonic series, typically using Legendre polynomials. A symmetrical arrangement of coils cancels the odd order field harmonics in an inner working volume, and we can chose the ampere-turns $n_1$, $n_2$, $n_3$ etc. such that the even orders are cancelled. It is straightforward to extend the concept to coils with real cross-section.

If three, or more, such magnets (ie: coil groups) are co-axially nested, the internal fields are superimposed and the resultant field will also be homogeneous. In accordance with the invention, we can then scale the ampere-turns in the outer two (or more) coil groups to null the first and second order harmonics in a region outside the space envelope of the coils (centered at a position Z along the axis of the coils), without affecting the homogeneity of the internal field (although the internal field strength will of course be changed). A system of three nested coil groups will allow first and second harmonics to be cancelled, four coil groups will allow $1^{st}$, $2^{nd}$ and $3^{rd}$ to be cancelled, etc.

Figure 1:
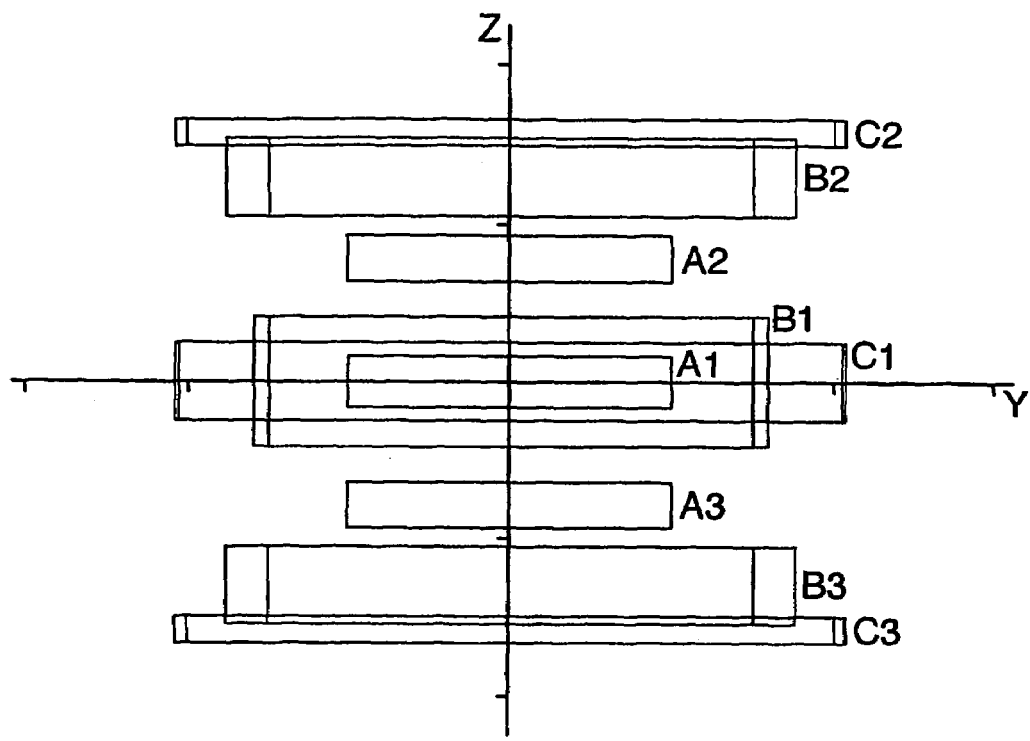
FIG. 1 is a schematic diagram of a first example.

Such a system is illustrated in FIG. 1 with coils A1, A2, A3, forming one positive magnet C1, C2, C3 another positive magnet and B1, B2, B3 forming a negative magnet.

This first embodiment is defined in more detail below.

FIRST EMBODIMENT

Each coil is characterised by the dimensions $a_1$ inner winding radius $a_2$ outer winding radius $b_1$ and $b_2$ axial position of the ends J current density.

In this example, the units are metres, amperes per square metre and tesla.

| | | Dimensions | | | | |
|---|---|---|---|---|---|---|
| sub-magnet | coil | $a_1$ | $a_2$ | $b_1$ | $b_2$ | J |
| A | 1 | 0.5003 | 0.5028 | −0.0813 | 0.0813 | 7.0800E+08 |
| A | 2 | 0.5000 | 0.5050 | 0.2959 | 0.4425 | 7.0800E+08 |
| A | 3 | 0.5000 | 0.5050 | −0.4425 | −0.2959 | 7.0800E+08 |
| B | 1 | 0.7547 | 0.7967 | −0.2090 | 0.2090 | −2.2963E+07 |
| B | 2 | 0.7500 | 0.8829 | 0.5284 | 0.7722 | −2.2963E+07 |
| B | 3 | 0.7500 | 0.8829 | −0.7722 | −0.5284 | −2.2963E+07 |
| C | 1 | 1.0276 | 1.0351 | −0.1250 | 0.1250 | 1.6000E+08 |
| C | 2 | 1.0000 | 1.0375 | 0.7463 | 0.8326 | 1.6000E+08 |
| C | 3 | 1.0000 | 1.0375 | −0.8326 | −0.7463 | 1.6000E+08 |

Gradients
The units are tesla · m$^{-n}$

| | z = 0 | | | | z = 1.275 | | | |
|---|---|---|---|---|---|---|---|---|
| sub-magnet | $B_0$ | $B_2$ | $B_4$ | $B_6$ | $B_0$ | $B_1$ | $B_2$ | $B_3$ |
| A | 9.881E−01 | −3.441E−03 | 1.847E−01 | −2.886E+04 | 1.133E−01 | −2.682E−01 | 8.007E−01 | −2.730E+00 |
| B | −8.660E−01 | −2.898E−04 | 8.543E−03 | 1.248E+03 | −3.694E−01 | 6.329E−01 | −9.056E−01 | −6.853E−01 |
| C | 4.970E−01 | 2.309E−04 | −2.342E−03 | −2.319E+03 | 3.083E−01 | −3.556E−01 | 1.074E−01 | 1.569E+00 |
| total | 6.191E−01 | −3.500E−03 | 1.909E−01 | −2.993E+04 | 5.224E−02 | −9.100E−04 | 2.510E−03 | −1.846E+00 |

Figure 2:
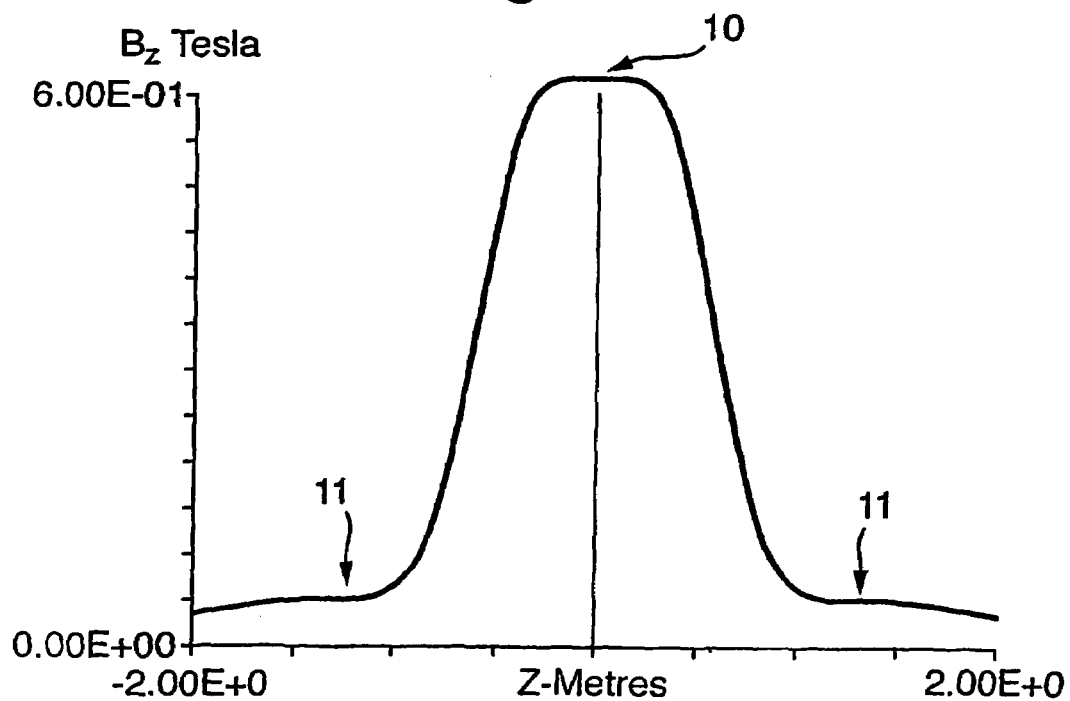
FIG. 2 is a field plot of magnetic fields along the Z-axis of the example shown in FIG. 1.

FIG. 2 is a field plot showing the way in which magnetic field varies along the Z-axis of the FIG. 1 example. As can-be seen, a central working volume 10 with a substantially homogeneous magnetic field is generated centrally of the assembly while a pair of second working volumes 11 with, as explained above, first and second order gradients substantially cancelled are generated at about 1.27 m from the centre, ie. outside the envelope of the assembly.

SECOND EMBODIMENT

A second example can be obtained by combining coils B2 and C2, and replacing them with a new coil B2'. Similarly, B3 and C3 can be replaced by new B3'. This is achieved by minimising the function $$\left(\frac{r_0^2}{2!}(B_2(0) - B_2'(0))\right)^2 + \left(\frac{r_0^4}{4!}(B_4(0) - B_4'(0))\right)^2 +$$

$$(r_0(B_1(w) - B_1'(w)))^2 + \left(\frac{r_0^2}{2!}(B_2(w) - B_2'(w))\right)^2$$

where the prime denotes the gradients due to the new coil,

The results of such a procedure are:

| | | Dimensions | | | | |
|---|---|---|---|---|---|---|
| sub-magnet | coil | $a_1$ | $a_2$ | $b_1$ | $b_2$ | J |
| B | 2 | 0.7500 | 0.8829 | 0.5284 | 0.7722 | −2.2963E+07 |
| C | 2 | 1.0000 | 1.0375 | 0.7463 | 0.8326 | 1.6000E+08 |
| B | 2' | 0.68340 | 0.80918 | 0.48129 | 0.61439 | −2.2963E+07 |

Gradients

| | z = 0 | | | z = 1.275 | | |
|---|---|---|---|---|---|---|
| coil | $B_0$ | $B_2$ | $B_4$ | $B_0$ | $B_1$ | $B_2$ |
| B2 + C2 | −1.1752E−01 | −4.3549E−01 | 1.0070E+01 | 3.1485E−01 | 2.3801E−01 | −7.0251E−01 |
| B2' | −1.6960E−01 | −4.4230E−01 | 1.3767E+01 | 1.1903E−01 | 2.3883E−01 | −4.7003E−01 |
| new system | 5.1494E−01 | −1.7137E−02 | 7.5652E+00 | −2.4712E−02 | 1.1888E−02 | 2.1922E−01 |

It can be seen that the cancellation of the higher orders is not perfect, but could be corrected by adjustments to one or more of the other coils in the system, or through the use of local shim coils. It can also be seen that the field in the external homogeneous region is now of the opposite polarity. This is because the $B_0$ terms were not included in the minimisation procedure.

Reduced Derivatives

The reduced derivatives are a measure of the field excursion over a distance, $r_0$, characteristic of the homogeneous volume:

$$B'_n = \frac{r_0^n}{n!} B_n$$

In this case $r_0=0.1$ m and the units are teslas

|  | z = 0 | | | | z = 1.275 | | | |
| --- | --- | --- | --- | --- | --- | --- | --- | --- |
| sub-magnet | $B_0$ | $B_2$ | $B_4$ | $B_6$ | $B_0$ | $B_1$ | $B_2$ | $B_3$ |
| A | 9.88E−01 | −1.72E−05 | 7.69E−07 | −4.01E−05 | 1.13E−01 | −2.68E−02 | 4.00E−03 | −4.55E−04 |
| B | −8.66E−01 | −1.45E−06 | 3.56E−08 | 1.73E−06 | −3.69E−01 | 6.33E−02 | −4.53E−03 | −1.14E−04 |
| C | 4.97E−01 | 1.15E−06 | −9.76E−09 | −3.22E−06 | 3.08E−01 | −3.66E−02 | 5.37E−04 | 2.62E−04 |
| total | 6.19E−01 | −1.75E−05 | 7.95E−07 | −4.16E−05 | 5.22E−02 | −9.10E−05 | 1.26E−05 | −3.08E−04 |

It can be seen that the first and second order gradients at z=1.275 m are substantially cancelled, while the homogeneity at z=0 is retained.

Figure 3:
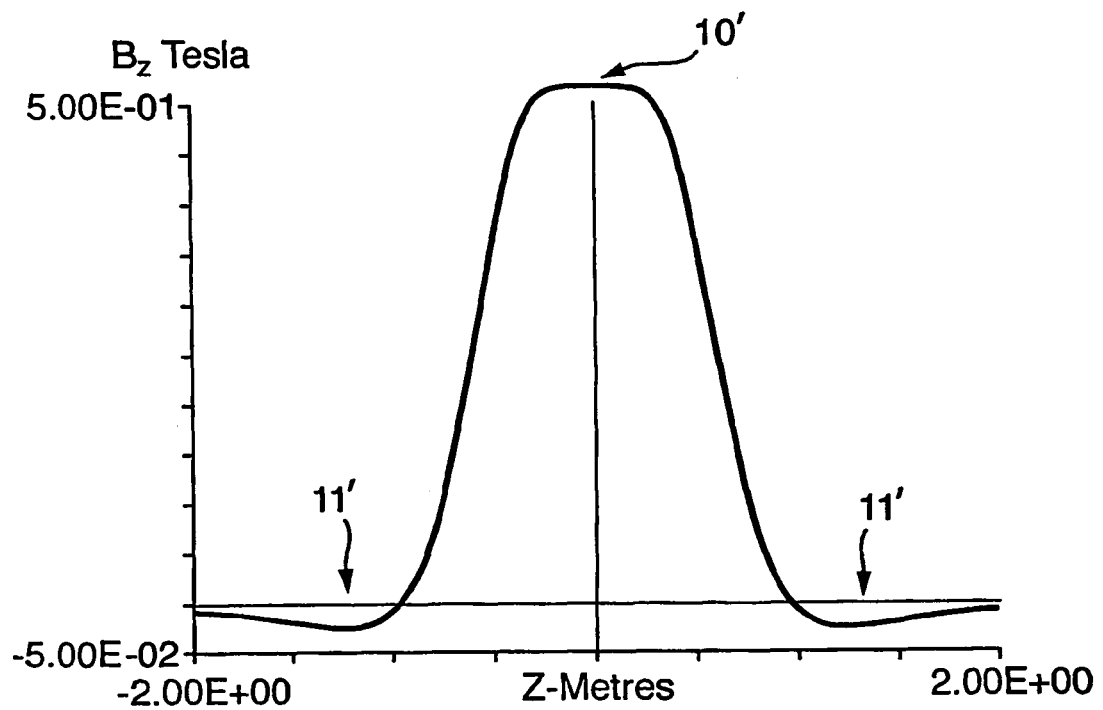
FIG. 3 is a field plot similar to FIG. 2 but for a second example.

FIG. 3 illustrates a field plot of the second embodiment showing working volumes 10', 11'.

We will now describe a method for designing such an assembly.

It is well known that in a volume of space not containing electrical current the magnetic scalar potential can be described by Laplace's equation, $\nabla^2 V=0$, which in cases of cylindrical symmetry can be solved for the magnetic field $\vec{H}=-\nabla V$ to give for the axial component $$H_z = \sum_{l=1}^{\infty} \frac{2l+1}{4\pi} A_l \rho^{l-1} l P_{l-1}(\cos\theta)$$

where the $P_n(\mu)$ are the Legendre polynomials.

If we consider the variation of the field in the axial (Z) direction only, we can write down the value of $H_z$ at any point on the axis using a Taylor expansion:

$$H_z(z) = H_0 + H_1 z + H_2 z^2 + \ldots = \sum_{n=0}^{\infty} H_n z^n$$

where $H_0$ is the field at the origin and $$H_n = \frac{1}{n!} \left.\frac{\partial H_z}{\partial z^n}\right|_{z=0}$$

This must be identical to the previous equation using Legendre polynomials, if we put $\theta=0$ and $\rho=z$.

$$\text{Hence } H_z(z) = \sum_{1}^{\infty} \frac{l(2l+1)}{4\pi} A_l z^{l-1}$$

$$= \sum_{0}^{\infty} H_n z^n$$

so that $A_l = \dfrac{4\pi}{l(2l+1)} H_{l-1}$ and $$H_z = \sum_{0}^{\infty} H_n \rho^n P_n(\cos\theta)$$

The $H_n$ is referred to as the nth-order gradient of the field and the field excursion at a distance $r_0$ due to the nth order gradient is then $$\frac{r_0^n}{n!} H_n.$$

Instead of the magnetic field strength H the flux density or magnetic induction B is often used. In the absence of magnetic materials $B=\mu_0 H$.

If a magnet consisting of an ensemble of co-axial coils is considered, then each coil will make its own contribution to the field and to the gradients.

$$H_n = \sum_{coils} H_{n_i}$$

In general the magnitude, and for orders greater than zero, the sign of the gradients will depend not only on the strength of the coil (for example expressed in ampere-turns) but also on its position (radius and axial displacement) relative to the origin. Thus it is possible to arrange a system of coils so that they produce a net field (zero order gradient) while some of the higher order gradients cancel. Typically, a substantially homogeneous field is produced over a volume suitable for NMR imaging if all the gradients up to and including fourth or sixth order are cancelled. Generally, gradients up to and including fourth order may be cancelled by a symmetrical arrangement of three coils. Adding further coils allows more degrees of freedom so that higher orders may be cancelled.

Figure 4:
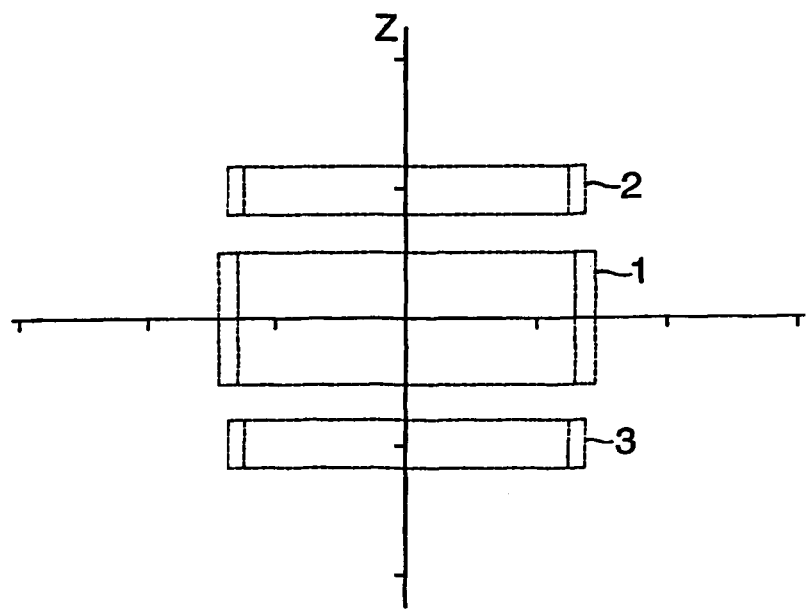
FIGS. 4 and 5 illustrate different stages in a design process.

For a magnet which is symmetrical about the origin, the odd orders cancel automatically, for a three-coil system we can solve the equations:

$$N_1 H_{0_1} + N_2 H_{0_2} + N_3 H_{0_3} = H_0$$

$$N_1 H_{2_1} + N_2 N_2 H_2 = N_3 H_{2_3} = 0$$

$$N_1 H_{4_1} + N_2 H_{4_2} + N_3 H_{4_3} = 0$$

where $N_1$, $N_2$, $N_3$ are the strengths of the coils. For a symmetrical system, coil 1 could be placed centrally, and coils 2 and 3 disposed symmetrically on either side of it, with $N_2 = N_3$ as shown in FIG. 4.

Other configurations are possible involving three or more coil.

Figure 5:
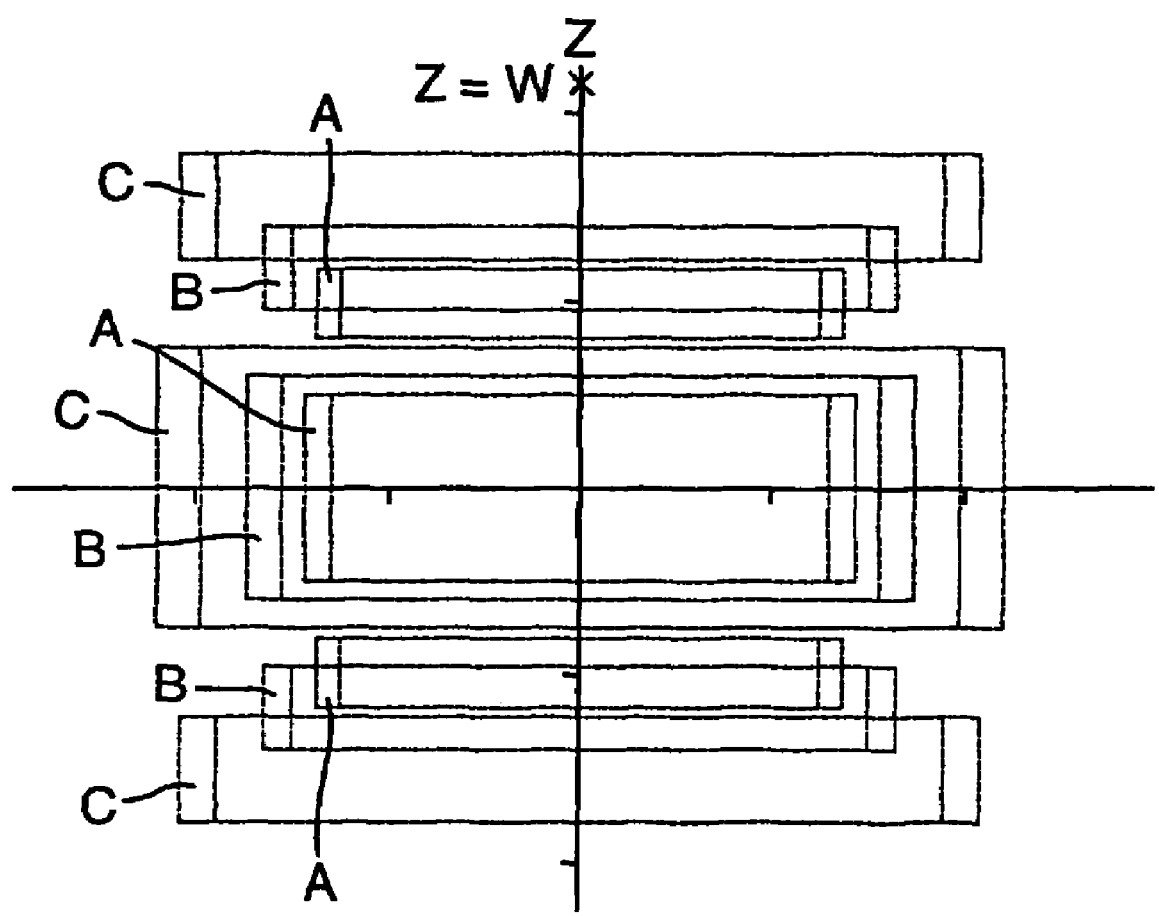

This sort of system produces a homogeneous region in the centre, but away from the centre, and particularly beyond the end of the magnet the field strength decreases rapidly. At some point along the axis, $z=\omega$, we can similarly express the field variation over space in terms of a series of gradients. This time, the gradients are the coefficients in a Taylor expansion of the field strength about $z=\omega$. It is possible to have a system consisting of a number, typically three or more, of such homogeneous magnets arranged concentrically, for example as shown in FIG. 5.

The total field in the centre will still be homogeneous because $H_{n_A}(0)=0$, $H_{n_B}(0)=0$, $H_{n_C}(0)=0$ for n=1, 2, 3, 4 but because of their different sizes, the magnets have different values of the gradients at $z=\omega$ from each other. By arranging one or more of the magnets to be energised in opposition to the others it is then possible to cancel the first and second order gradients in a three-magnet system, or first, second and third order gradients for a four magnet system, and so on. The strengths, M, of the individual magnets are chosen to satisfy the equations $$M_A H_{1_A}(\omega) + M_B H_{1_B}(\omega) + M_C H_{1_C}(\omega) = 0$$

$$M_A H_{2_A}(\omega) + M_B H_{2_B}(\omega) + M_C H_{2_C}(\omega) = 0$$

The two equations in three unknowns yield two of the strengths in terms of the third one, which is then chosen to give the required overall field strength $M_A H_{0_A}(\omega) + M_B H_{0_B}(\omega) + M_C H_{0_C}(\omega)$.

In this example of three magnets each with three coils, which is included to show the reasoning behind the invention, the six individual coil strengths (two for each magnet) are selected to so that the individual components of the gradients $H_2(0)$, $H_4(0)$, $H_1(\omega)$, and $H_2(\omega)$ cancel each other. In addition, it is necessary to determine an absolute field strength $H_0(\omega)$ or $H_0(0)$. Unless it is required to fix absolute values of the fields at both homogeneous sites, there are five parameters and six unknowns so that the system is redundant. This would enable some of the coils to be combined. For example coils 2 and coils 3 on magnets A and B could be replaced by a single coil each, shared between magnets A and B. This would mean that magnets A and B were no longer individually homogeneous but this would not matter provided that the complete system retained its homogeneity. It might be desirable to take this process further and alter the strengths of the other coils, while retaining the overall cancellation. This might be required for reasons such as obtaining the best distribution of electromagnetic stresses, or the minimum use of conductor.

Systems such as this, which cannot be analysed into a number of individually homogeneous magnets can be designed using iterative methods. Typically, a computerised procedure will be used to minimise an error function such as $$(H_0(0) - H_{req})^2 + \left(\frac{r_0^2}{2!} H_2(0)\right)^2 + \left(\frac{r_0^4}{4!} H_4(0)\right)^2 + (r_0 H_1(w))^2 + \left(\frac{r_0^2}{2!} H_2(w)\right)^2$$

where $H_{req}$ is the required central field and $r_0$ is a dimension characteristic of the homogeneous volume.

The invention claimed is:

1. A magnetic field generating assembly comprising: a set of coils substantially symmetrically arranged about a plane orthogonal to the axis, wherein at least some of the coils carry working currents in the opposite sense to the other coils, the arrangement of turns and working currents carried by the coils being such that a first working volume with a substantially homogeneous magnetic field is generated within an envelope defined by the assembly, and two second working volumes each with a substantially homogeneous magnetic field are generated outside the envelope, the homogeneity of each of the first and second working volumes being sufficient to perform a NMR experiment on a sample in the working volume.

2. An assembly according to claim 1, wherein the size of the second working volume is less than the size of the first working volume for the same homogeneity.

3. An assembly according to claim 1 or claim 2, wherein all the working volumes are centred on the axis.

4. An assembly according to claim 1, wherein the coils are arranged in groups, members of each group being electrically connected in series.

5. An assembly according to claim 4, wherein the members of each group have substantially the same mean radius.

6. An assembly according to claim 5, wherein the mean radius of one group is different from the mean radius of another group.

7. An assembly according to claim 4, wherein one of the groups carries a working current in the opposite sense to another of the groups.

8. An assembly according to claim 5, 6, or 7, wherein each group generates by itself a substantially homogenous magnetic field in the first working volume.

9. An assembly according to claim 5, 6, or 7, wherein at least one of the groups comprises a central coil or coils and at least two end coils separated from the central coil(s) and arranged symmetrically with respect to the central coil(s).

10. A method of designing a magnetic field generating assembly, the method comprising:
   defining an arrangement of three groups of coils which are substantially coaxial and each of which generates a substantially homogenous magnetic field within a first working volume at the centre of each group; and
   determining working currents which must flow through the groups of coils in order to generate a substantially homogenous region in a second working volume external to be assembly.

11. An assembly according to claim 1 or 2, wherein the set of coils are substantially coaxial.

* * * * *